United States Patent [19]

Itoh et al.

[11] Patent Number: 5,242,544
[45] Date of Patent: Sep. 7, 1993

[54] METHOD OF MINUTELY ROUGHENING SUBSTRATE SURFACE BY ETCHING

[75] Inventors: Toshiaki Itoh; Sachio Asai, both of Matsusaka, Japan

[73] Assignee: Central Glass Company Limited, Ube, Japan

[21] Appl. No.: 935,450

[22] Filed: Aug. 28, 1992

[30] Foreign Application Priority Data

Aug. 30, 1991 [JP] Japan .................... 3-219485

[51] Int. Cl.$^5$ .................. B44C 1/22; C03C 15/00; C23F 1/00; B29C 37/00
[52] U.S. Cl. ..................... 156/659.1; 156/663; 156/664; 156/668; 156/904; 427/307; 427/309
[58] Field of Search ............ 156/659.1, 663, 664, 156/668, 654, 904; 252/79.2, 79.3, 79.4; 427/307, 309

[56] References Cited

U.S. PATENT DOCUMENTS

| | | | |
|---|---|---|---|
| 4,465,551 | 8/1984 | Horwitz | 156/663 X |
| 4,664,748 | 5/1987 | Ueno et al. | 156/659.1 |
| 5,120,605 | 6/1992 | Zuel et al. | 156/663 X |

*Primary Examiner*—William A. Powell
*Attorney, Agent, or Firm*—Keck, Mahin & Cate

[57] ABSTRACT

The object of the invention is to minutely roughen a surface of a substrate, e.g. a glass plate, by an etching method for the purpose of enhancing adhesion of a coating film to the substrate surface or preventing sticking of a certain article to the substrate surface. An easily vaporizable material such as a fat or wax as a masking material is used as a masking material, and the substrate surface is scattered with numerous microscopic droplets of the masking material by exposing the substrate surface to vapor of the masking material and simultaneously to vapor of another material, e.g. water or an alcohol, which is immiscible with the masking material and serves the purpose of preventing agglomeration of droplets of the masking material on the substrate surface. After that the substrate is etched with a suitable etching fluid, and then the masking material is removed. As the result the etched surface of the substrate is scattered with numerous microscopic, islet-like land regions.

11 Claims, No Drawings

METHOD OF MINUTELY ROUGHENING SUBSTRATE SURFACE BY ETCHING

BACKGROUND OF THE INVENTION

This invention relates to a method of minutely roughening a surface of a substrate by etching the substrate surface such that the etched surface is scattered with numerous microscopic islet-like land regions which are unetched regions. To provide the islet-like land regions the substrate surface is scattered with microscopic droplets of a masking material in advance of the etching operation.

Often it is desired to minutely roughen a smooth surface of a substrate. In many cases the purpose of roughening a substrate surface is to enhance the adhesion of a paint film or a functional coating film to the substrate surface, and in some cases the purpose is to prevent sticking of a certain article to the substrate surface such as, for example, sticking of a magnetic head to a magnetic disk surface or sticking of a paper sheet to a glass plate used in a copying machine.

One of possible methods for minutely roughening a substrate surface is etching the substrate surface with suitable masking. Particularly in the case of a glass or ceramic substrate it is desirable that minute roughening of the surface could be accomplished by an etching method.

It is a well known technique to form a relief pattern on a glass substrate by masking the substrate surface in the areas of the aimed relief pattern with an erosion resistant synthetic resin or rubber and then etching the exposed areas of the substrate surface with a suitable etching agent such as hydrofluoric acid. The masking is made by screen-printing or photolithography. However, in the case of minutely roughening a substrate surface it is necessary to leave the surface unetched in numerous dot-like regions each of which is only tens of micrometers or smaller in diameter, and it is very difficult to mask such dot-like regions by a conventional method.

SUMMARY OF THE INVENTION

It is an object of the present invention to provide an etching method for minutely roughening a surface of a substrate, which method employs a novel technique to easily mask the substrate surface in substantially uniformly distributed dot-like regions to leave these regions unetched and is applicable to various substrates such as glass, ceramic, metal and synthetic resin substrates.

According to the invention there is provided a method of minutely roughening a surface of a substrate by etching the substrate surface such that the etched surface is scattered with a large number of microscopic islet-like land regions, the method comprising the steps of (a) exposing the substrate surface to vapor of a masking material and simultaneously to vapor of an agglomeration inhibiting material, which is immiscible with the masking material, such that the masking material deposits on the substrate surface in a large number of substantially uniformly distributed dot-like regions and allowing the masking material on the substrate surface to condense into microscopic droplets; (b) after step (a) etching the substrate surface with an etching fluid; and (c) after step (b) removing the masking material from the substrate surface.

In this invention it is suitable to use an oil, fat or wax as the masking material.

In this invention the matter of primary importance is to prevent agglomeration of the masking material on the surface of the substrate. If the masking material agglomerates on the substrate surface the desire of minutely roughening the substrate surface is hardly accomplished. If only vapor of the masking material is applied to the substrate surface it is inevitable that the masking material agglomerates on the substrate surface, and in an extreme case the substrate surface is thoroughly covered with the masking material so that the surface cannot be etched.

To prevent agglomeration of the masking material on the substrate surface vapor of another material, which is immiscible with the masking material, is applied to the substrate surface together with the vapor of the masking material. By using this technique it becomes possible to deposit the masking material on the substrate surface in the form of uniformly distributed microscopic droplets. In the subsequent etching operation the substrate surface remains unetched in the dot-like regions covered with the droplets of the masking material. When the masking material is removed the unetched regions appear as microscopic islet-like land regions which render the substrate surface minutely uneven or roughened. By the method according to the invention it is easy to form substantially uniformly distributed islet-like land regions having a diameter of few micrometers to tens of micrometers.

The surface roughening method according to the invention is applicable to various substrates including glass substrates, ceramic substrates, metal substrates and synthetic resin substrates. When a coating is made on a substrate surface minutely roughened by a method of the invention the coating film very firmly adheres to the substrate surface. From another aspect the minutely roughened surface of the substrate exhibits improved lubricity which is favorable for certain uses of the substrates. For example, in the case of a glass plate used as document glass in an electrophotographic copying machine the minute roughening of the glass surface has the effect of preventing sticking of a paper sheet to the glass surface. In the case of a magnetic disk for computers the minute roughening of the disk surface is effective for preventing sticking of a magnetic head to the disk.

DESCRIPTION OF THE PREFERRED EMBODIMENTS

This invention uses a masking material that can easily be vaporized. Since it is essential to deposit microscopic droplets of the masking material on the substrate surface, the masking material must be relatively high in surface energy and rather bad in compatibility with the substrate material. Furthermore, the masking material needs to be insoluble in the etching agent to be used and stable to the etching agent.

As the masking material it is preferred to use a fat such as a glyceryl ester of a fatty acid such as palmitic acid, stearic acid, linoleic acid or linolenic acid or a wax such as paraffin wax or polyethylene wax.

The agglomeration inhibiting material (hereafter referred to as agglomeration inhibitor) used in this invention is an easily vaporizable material. In condensing vapor of the masking material on the substrate surface the role of the agglomeration inhibitor is to prevent agglomeration of the masking material deposited on the substrate surface in order that the substrate surface may be uniformly scattered with microscopic droplets of the masking material. Therefore the agglomeration inhibitor must be immiscible with and insoluble or hardly soluble in the masking material. Furthermore, the agglomeration inhibitor needs to be easily removed from the substrate surface by the action of the etching agent on the substrate surface or to be well miscible with the etching agent.

As the agglomeration inhibitor it is preferred to use water, an alcohol or a different organic liquid. For example, in the case of etching a glass or ceramic substrate with hydrogen fluoride gas or a hydrofluoric acid solution by using a paraffin wax as the masking material it is suitable to use water or a vegetable oil as the agglomeration inhibitor. In the case of etching a metal substrate with a mineral acid by using a fat as the masking material an alcohol is suitable as the agglomeration inhibitor. In the case of etching a synthetic resin substrate such as, for example, a polycarbonate substrate with an organic etchant such as acetone or benzene water can be used as the agglomeration inhibitor. In any case it is suitable to diffuse vapor of the agglomeration inhibitor into the vapor of the masking material.

The invention is illustrated by the following nonlimitative examples.

EXAMPLE 1

In this example the object of surface treatment was a soda-lime silica glass plate 305 mm square in widths and 3 mm in thickness. The glass plate had smooth surfaces on both sides. A paraffin wax was used as the masking material and water (steam) as the agglomeration inhibitor.

As the apparatus for applying the masking material to the glass plate, a vapor generator was produced by using a box-like vessel of stainless steel. Electric heaters were provided to the box-like vessel on the outer surfaces of the bottom and side walls. Besides, four holes were bored through the side walls of the box-like vessel, and a pipe was inserted into each of the four holes in order to introduce steam into the vessel.

In the vapor generator the paraffin wax was heated to about 200° C. to generate vapor of paraffin, while steam was generated in a separate vessel and continuously introduced into the vapor generator through the aforementioned pipes so as to diffuse into the paraffin vapor. The glass plate was laid on the open top of the vapor generator and left exposed to the mixture of the paraffin vapor and steam for about 60 sec. In the vapor generator the proportion of the paraffin vapor to steam was about 4:1 by weight. After that the glass plate was cooled to room temperature. As the result, a surface (referred to as the first surface) of the glass plate was scattered with uniformly distributed microscopic droplets of the paraffin wax.

Next the glass plate was immersed in an etching liquid, which was 0.5 wt % aqueous solution of hydrofluoric acid. The glass plate was kept in the etching liquid for about 15 sec. Soon after withdrawing the glass plate from the etching liquid the paraffin wax droplets on the glass plate were removed by brushing while washing the glass plate with water. After that the glass plate was washed with a dilute aqueous solution of an alkaline detergent, then with hot water and next with purified water, wiped with isopropanol and dried.

By the above process the first surface of the glass plate was minutely roughened such that shallowly etched regions and islet-like land regions were uniformly distributed. Observing under a differential interference microscope, the area ratio of the etched regions to the islet-like land regions was about 3:7, and each of the islet-like land regions was from about 10 $\mu$m to about 25 $\mu$m in diameter. By measuring with a surface roughness tester the height of each land region (i.e. depth of the etched regions) was from about 20 nm to about 30 nm. Needless to mention the islet-like land regions were provided by the initial surface of the glass plate, so that the minutely roughened surface of the glass plate retained the flatness of surface without exhibiting unwanted irregularities such as waviness.

A test was made to examine the degree of lubricity of the minutely roughened surface of the glass plate. The glass plate was held horizontally the minutely roughened surface up, and a sheet of plain paper for use in electrophotographic copying machines was laid on the surface of the glass plate, and a weight was placed on the paper sheet. Then the glass plate was gradually tilted until the paper sheet began to slip down together with the weight. Slipping of the paper sheet began when the angle of tilt reached 18–20 degrees.

For comparison, the same test was made on the smooth surface of the glass plate without making the surface roughening treatment. In this case the paper sheet and the weight did not slip down until the angle of tilt of the glass plate reached 26–30 degrees. The difference in the paper slipping angle indicates that the minutely roughened surface of the glass plate is better in lubricity.

Another test was made to examine the strength of adhesion of a metal coating film to the minutely roughened surface of the glass plate. By a sputtering method a thin film of tin having a thickness of about 30 nm was deposited on the minutely roughened surface of the glass plate. A cellophane tape was applied onto the tin film, and the cellophane tape was peeled away in the manner of a peel test on a paint film. The test resulted in no peeling of the tin film from the glass surface.

For comparison, the same test was made on the smooth surface of the glass plate without making the surface roughening treatment. In this case peeling of the cellophane tape caused more than 40% of the tin film to peel from the glass surface.

EXAMPLE 2

The glass surface roughening process of Example 1 was modified only in the following respects.

A larger quantity of steam was introduced into the vapor generator such that the proportion of the paraffin vapor to steam became about 1:1 by weight.

On the vapor generator the glass plate was slowly rotated about a center axis of the plate in order to alternately expose the both surfaces of the glass plate to the mixture of the paraffin vapor and steam, and the vapor treatment time was extended to 120 sec.

There was no change in the etching treatment and the subsequent washing procedure. As the result the both surfaces of the glass plate were minutely roughened.

In each surface of the treated glass plate the area ratio of the etched regions to the islet-like land regions was about 4:6, and each of the islet-like land regions was from about 3 $\mu$m to about 20 $\mu$m in diameter and from about 22 nm to about 30 nm in height.

The two tests described in Example 1 were made on the glass plate surfaces roughened in Example 2. In the paper slipping test, the paper sheet began to slip down together with the weight when the angle of tilt of the glass plate reached 16-19 degrees. In the peel test the tin film did not peel from the glass surface in the least.

The glass surface roughening treatments of the above examples were respectively repeated except that the agglomeration inhibitor was selected from alcohols and vegetable oils instead of water. In every case a nearly similarly good result was obtained.

COMPARATIVE EXAMPLE

The glass surface roughening process of Example 1 was modified by omitting to introduce steam into the vapor generator in which the paraffin wax was vaporized. That is, no agglomeration inhibitor was used in depositing the paraffin wax on the glass plate surface. In this case a surface of the glass plate was exposed to the paraffin vapor for about 40 sec.

After that the etching treatment in Example 1 was made in the same manner except that the duration of immersion of the glass plate in the hydrofluoric acid solution was extended to about 20 sec. Then the glass plate was washed by the same process as in Example 1.

As the result the surface of the glass plate remained almost unetched, though the surface was sparsely scattered with pinhole-like etched regions. On this glass surface the paper slipping test was made. The paper sheet and the weight did not slip down until the angle of tilt of the glass plate reached 21-25 degrees.

In another run the masking operation with the paraffin vapor was continued for 120 sec. As the result the glass plate surface was substantially entirely masked with the paraffin wax, and it was apparent that the masked surface could not be etched in the desired manner.

What is claimed is:

1. A method of minutely roughening a surface of a substrate by etching the substrate surface such that the etched surface is scattered with a large number of microscopic islet-like land regions, the method comprising the steps of:
    (a) exposing said surface of the substrate to vapor of a masking material and simultaneously to vapor of an agglomeration inhibiting material, which is immiscible with said masking material, such that said masking material deposits on said surface of the substrate in a large number of substantially uniformly distributed dot-like regions and allowing the masking material on said surface of the substrate to condense into microscopic droplets;
    (b) after step (a) etching said surface of the substrate with an etching fluid; and
    (c) after step (b) removing the masking material from said surface of the substrate.
2. A method according to claim 1, wherein said masking material is selected from the group consisting of fats and wax.
3. A method according to claim 2, wherein said agglomeration inhibiting material is water.
4. A method according to claim 2, wherein said agglomeration inhibiting material is an organic liquid.
5. A method according to claim 4, wherein said organic liquid is an alcohol.
6. A method according to claim 2, wherein said masking material is a paraffin wax.
7. A method according to claim 2, wherein said masking material is a polyethylene wax.
8. A method according to claim 2, wherein said masking material is a glyceryl ester of a fatty acid selected from the group consisting of palmitic acid, stearic acid, linoleic acid and linolenic acid.
9. A method according to claim 1, wherein at step (a) said vapor of said agglomeration inhibiting material is dispersed in said vapor of said masking material.
10. A method according to claim 1, wherein said substrate is a glass substrate.
11. A method according to claim 10, wherein said etching fluid comprises hydrogen fluoride.

* * * * *